United States Patent [19]

Shanklin

[11] Patent Number: 5,100,755

[45] Date of Patent: Mar. 31, 1992

[54] DYE-BENZYLTRIARYL BORATE PHOTOINITIATORS AND PHOTOHARDENABLE COMPOSITION CONTAINING THESE PHOTOINITIATORS

[75] Inventor: Michael S. Shanklin, Dayton, Ohio

[73] Assignee: The Mead Corporation, Dayton, Ohio

[21] Appl. No.: 457,460

[22] Filed: Dec. 27, 1989

[51] Int. Cl.$^5$ .............................. G03F 7/029
[52] U.S. Cl. ........................ 430/138; 430/281; 430/914; 522/31
[58] Field of Search ............... 430/138, 281, 914; 522/31, 25, 15

[56] References Cited

U.S. PATENT DOCUMENTS

| | | | |
|---|---|---|---|
| 3,567,453 | 3/1971 | Borden | 430/339 |
| 4,772,530 | 9/1988 | Gottschalk et al. | 430/138 |
| 4,772,541 | 9/1988 | Gottschalk et al. | 430/339 |
| 4,800,149 | 1/1989 | Gottschalk et al. | 430/138 |
| 4,842,980 | 6/1989 | Gottschalk et al. | 430/138 |
| 4,865,942 | 9/1989 | Gottschalk et al. | 430/138 |
| 4,874,450 | 10/1989 | Gottschalk et al. | 156/275 |
| 4,895,880 | 1/1990 | Gottschalk et al. | 522/31 |
| 4,902,604 | 2/1990 | Yamaguchi et al. | 430/281 |
| 4,937,159 | 6/1990 | Gottschalk et al. | 430/914 |
| 4,950,581 | 8/1990 | Koike et al. | 522/25 |
| 4,952,480 | 8/1990 | Yamaguchi | 430/914 |

*Primary Examiner*—Marion E. McCamish
*Assistant Examiner*—Christopher D. Rodee
*Attorney, Agent, or Firm*—Thompson, Hine and Flory

[57] ABSTRACT

The present invention is directed to a photoinitiator complex having the formula (I):

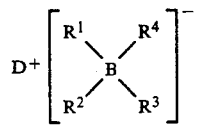

wherein $D+$ is a cationic dye moiety; $R^1$ is a benzyl or substituted benzyl group; and $R^2$, $R^3$ and $R^4$ are aryl or substituted aryl groups, wherein said photoinitiator is capable of absorbing actinic radiation and producing free radicals.

10 Claims, No Drawings

DYE-BENZYLTRIARYL BORATE PHOTOINITIATORS AND PHOTOHARDENABLE COMPOSITION CONTAINING THESE PHOTOINITIATORS

BACKGROUND

The present invention relates to a novel class of cationic dye-borate anion complexes which are capable of absorbing actinic radiation and producing free radicals which can initiate polymerization or crosslinking of free radical polymerizable or crosslinkable compounds. These cationic dye-borate anion complexes are useful as photoinitiators and in photohardenable compositions and photosensitive materials containing the same.

U.S. Pat. Nos. 4,772,541 and 4,772,530 to The Mead Corporation disclose a novel class of photoinitiators which are compounds consisting of an ionic photoreducible or photooxidizable dye and a counter ion which absorb light and generate a free radical. The preferred photoinitiators are complexes of a cationic dye and an alkyltriaryl borate anion. While these photoinitiators are suitable for many applications there is a desire to design photoinitiators which provide higher film speeds.

SUMMARY OF THE INVENTION

The present invention provides a novel class of photoinitiators which provide higher film speeds. These photoinitiators are represented by the formula (I):

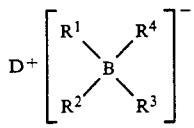

where $D^+$ is a cationic dye, $R^1$ is a benzyl group and $R^2$, $R^3$ and $R^4$ represent aryl groups. The characteristics of the basic borate anion may be altered to improve stability, speed of polymerization, and solubility by incorporating onto the benzyl and aryl rings various electron donating groups such as amino, dimethylamino, hydroxy, methoxy, t-butyl, or methyl; or various electron withdrawing groups such as phenyl, fluro, chloro, bromo, iodo, —COOH, —COOR where R is a lower alkyl group, methylcarbonyl, trifluoromethyl, cyano, methylsulfone, or nitro. Accordingly, the terms benzyl and aryl are meant to include substituted benzyl and substituted aryl groups.

Representative examples of the benzyl groups represented by $R^1$ include benzyl, tert-butylbenzyl, fluorobenzyl, chlorobenzyl, trifluoromethylbenzyl, methoxybenzyl, dimethylaminobenzyl, methylbenzyl, and the like.

Representative examples of the aryl groups represented by $R^1$, $R^2$ and $R^3$ include phenyl, naphthyl, anisyl, methylphenyl, dimethylphenyl, fluorophenyl, chlorophenyl, methoxyphenyl, tert-butylphenyl, di-tert-butylphenyl, and the like.

Preferably the photoinitiators are represented by the formula (II):

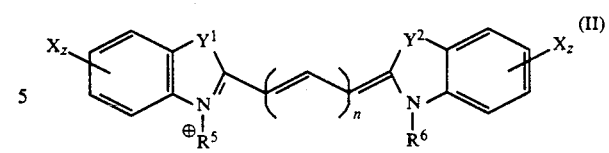

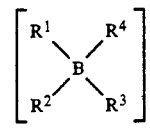

where $y^1$ and $y^2$ are the same or different and represent an oxygen atom, a sulfur atom, a selenium atom, a vinyl group, $>C(CH_3)_2$, or $>N-R^7$ where $R^7$ is a short chain alkyl group; n is 0, 1, 2, or 3; z is 1 to 4; $R^5$ and $R^6$ are alkyl groups and preferably an alkyl group having at least 4 and preferably at least 7 carbon atoms; X is selected based on the desired absorption characteristics of the cationic dye-borate anion complex and may be selected from a large number of substituents in a manner known in the art. X may be a hydrogen atom; an electron donating group such as amino, dimethylamino, hydroxy, methoxy, t-butyl, or methyl; or X may be an electron withdrawing group such as phenyl, fluoro, chloro, bromo, iodo, —COOH, —COOR where R is a lower alkyl group, methylcarbonyl, trifluoromethyl, cyano, methylsulfonyl, or nitro.

It has been shown that only a small amount of n-alkyl borate radicals in cyanine borate-initiated polymerization of acrylates escape the solvent cage to initiate polymerization. Recombination of the borate and cyanine radicals may be a significant factor in the loss of productive radicals. The benzyltriarylborates of the present invention provide a more stable radical for initiating free radical polymerization and should be less likely to recombine with the cyanine radical before diffusing from the solvent cage. Consequently, these cyanine-benzyltriarylborate photoinitiators should provide media with greater photographic speed than previous initiators which use n-butylborate or other less stable borate compounds.

While the benzyltriarylborates of the present invention show an increase in polymerization speed over n-butylborate, they are still too slow in a positive working system. However, they may be useful in a negative working or direct write system wherein polymerization is inhibited upon exposure to light.

Accordingly, one manifestation of the present invention is a photoinitiator of the formula (I) and more preferably the formula (II) above.

Another manifestation of the present invention is a photohardenable composition containing a photoinitiator of the formula (I) and more preferably the formula (II).

Still another manifestation of the present invention is a photosensitive material comprising a support having a layer of the aforesaid photohardenable composition on the surface thereof.

Another manifestation of the present invention is a photosensitive material comprising a support having a layer of microcapsules containing the aforesaid photohardenable composition on the surface thereof.

DETAILED DESCRIPTION OF THE INVENTION

Methods useful in making the photoinitiators of the present invention, typical photohardenable compositions, and photosensitive materials are described in U.S. Pat. Nos. 4,772,530 and 4,772,541.

The photoinitiators of the present invention are characterized in that the borate anion includes a benzyl group and $R^2$, $R^3$ and $R^4$ represent phenyl groups.

Useful dyes form photoreducible but dark stable complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes. The dyes should not contain groups which would neutralize or desensitize the complex or render the complex poorly dark stable.

As a general rule, useful cationic dye-borate anion complexes must be identified empirically, however, potentially useful cationic dye and borate anion combinations can be identified by reference to the Weller equation (Rehm, D. and Weller, A., *Isr. J. Chem.* (1970), 8, 259–271), which can be simplified as follows.

$$\Delta G = E_{ox} - E_{red} - E_{hv} \quad \text{(Eq 1)}$$

where $\Delta G$ is the change in the Gibbs free energy, $E_{ox}$ is the oxidation potential of the borate anion, $E_{red}$ is the reduction potential of the cationic dye, and $E_{hv}$ is the energy of light used to excite the dye. Useful complexes will have a negative free energy change. Similarly, the difference between the reduction potential of the dye and the oxidation potential of the borate must be negative for the complex to be dark-stable, i.e., $E_{ox} - E_{red} > 0$.

As indicated, Eq. 1 is a simplification and it does not absolutely predict whether a complex will be useful in the present invention or not. There are a number of other factors which will influence this determination. One such factor is the effect of the monomer on the complex. It is also known that if the Weller equation produces too negative a value, deviations from the equation are possible. Furthermore, the Weller equation only predicts electron transfer, it does not predict whether a particular dye complex is an efficient initiator of polymerization. The equation is a useful first approximation.

The most typical example of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate.

The cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5% by weight.

While the cationic dye-borate anion complex can be used alone as the initiator, film speeds tend to be quite low and oxygen inhibition is observed. It has been found that it is preferable to use the complex in combination with an autoxidizer, particularly N,N-dialkylanilines. An autoxidizer is a compound which is capable of consuming oxygen in a free radical chain process.

Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylthioaniline, 4-amino-N,N-dimethylaniline, 3-hydroxy-N,N-dimethylaniline, N,N,N',N'-tetramethyl-1,4-dianiline, 4-acetamido-N,N-dimethylaniline, etc. Preferred N,N-dialkylanilines are 2,6-diisopropyl-N,N-dimethylaniline, 2,6-diethyl-N,N-dimethylaniline, N,N,2,4,6-pentamethylaniline (PMA) and p-t-butyl-N,N-dimethylaniline.

The autoxidizers are preferably used in the present invention in concentrations of about 4–5% by weight.

Thiols and disulfides also appear to enhance film speed although the mechanism is not clear. Particularly preferred thiols are selected from the group consisting of mercaptobenzoxazoles, mercaptotetrazines, mercaptotriazines and mercaptobenzothiazoles. Representative examples include 2-mercaptobenzothiazole, 6-ethoxy-2-mercaptobenzothiazole, 2-mercaptobenzoxazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzenethiol, 1-phenyl-1H-tetrazole-5-thiol, 4-phenyl-4H-1,2,4-triazole-3-thiol, 2-mercaptobenzimidazole, pentaerythritol tetrakis (mercaptoacetate), pentaerythritol tetrakis (3-mercaptoproprionate), trimethylolpropane tris(mercapto-acetate), 4-acetamidothiophenol, mercaptosuccinic acid, dodecanethiol, 2-mercaptopyridine, 4-mercaptopyridine, 2-mercapto-3H-quinazoline, and 2-mercaptothiazoline. Dissulfides as described in U.S. patent application Ser. No. 321,257 are also useful.

The photohardenable compositions of the present invention may be used in a wide variety of applications. They may be used to prepare photocurable resists, photoadhesives, photocurable coatings, photocurable inks, etc. They may also be microencapsulated and used in the full color panchromatic imaging system described in U.S. Pat. No. 4,772,541. A preferred method for microencapsulating the composition is described in U.S. patent application Ser. No. 370,103 filed June 22, 1989. A preferred developer material is described in U.S. Pat. No. 4,859,561.

Benzyltriphenyl borates can be made by the reaction of either benzylmagnesium chloride or benzyllithium with the corresponding triphenylboron. The resulting borate is metastisized with an appropriate dye.

EXAMPLE

To compare the photographic characteristics of dye complexes in accordance with the present invention and previous dye complexes, dye complexes in accordance with the present invention and comparative complexes were encapsulated with photopolymerizable compositions.

The encapsulated compositions were coated on a sheet of AlPET in an amount of 6 g/cm² using a slot head coater and dried.

The coated compositions were exposed through a 30 step wedge and subjected to densitometry. The results are shown in Table 1.

TABLE 1

| Initiator | Dmax | Dmin | Log 10% sens. | Log 90% sens. | DR* | Gamma |
|---|---|---|---|---|---|---|
| Magenta System Green light exposure | | | | | | |
| SI-253 (N-Butyltriphenylborate) | 2.57 | 0.09 | 3.17 | 2.90 | 0.37 | 5.44 |
| SI-308 (Benzyltriphenylborate) | 2.59 | 0.09 | 3.06 | 2.78 | 0.28 | 7.11 |
| Differences | | | +0.11 | +0.12 | | |
| Cyan System Red light exposure | | | | | | |
| SI-252 (N-Butyltriphenylborate) | 2.47 | 0.05 | 3.74 | 3.11 | 0.63 | 3.06 |
| SI-309 (Benzyltriphenylborate) | 2.52 | 0.08 | 3.53 | 2.88 | 0.65 | 2.95 |
| Differences | | | +0.21 | +0.23 | | |

*DR = Dynamic Range

The data shows an increase in speed of two steps for the cyan photoinitiator system using benzyltriphenylborate over the comparative system made with n-butylborate, while the magenta system showed a one step improvement in speed.

Having a described the invention in detail and by reference to preferred embodiments thereof, it will be apparent that modifications and variation are possible without departing from the scope of the invention defined in the appended claims:

What is claimed is:

1. A photohardenable composition which comprises a free radical polymerizable or crosslinkable compound and a photoinitiator complex comprising a cationic dye moiety and an anionic borate moiety, said complex being represented by the formula (I):

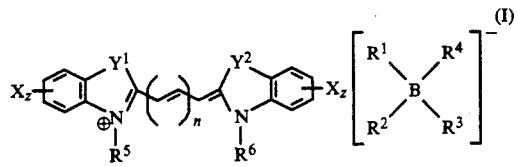

where Y¹ and Y² are the same or different and represent an oxygen atom, a sulfur atom, a selenium atom, a vinyl group, >C(CH₃)₂, or >N-R⁷ where R⁷ is a short chain alkyl group; n is 0, 1, 2 or 3; z is 1 to 4; R⁵ and R⁶ represent alkyl groups; X is a hydrogen atom, an electron withdrawing group or an electron donating group; R¹ is a benzyl or substituted benzyl group; and R², R³ and R⁴ are aryl or substituted aryl groups, wherein said photoinitiator is capable of absorbing actinic radiation and producing free radicals which can initiate free radical polymerization or crosslinking or said polymerizable or crosslinkable compound.

2. The photohardenable composition of claim 1 wherein the anioinc borate moiety of said photoinitiator complex is benzyltriphenylborate and said cationic dye moiety is selected from the group consisting of cationic cyanine, carbocyanine and hemicyanine dyes.

3. The photohardenable composition of claim 2 wherein said anionic borate moiety and said cationic dye moiety are present as a complex in an amount up to about 1% by weight based on the weight of the photopolymerizable or crosslinkable species in the photohardenable composition.

4. The photohardenable composition of claim 3 wherein said anionic borate moiety and said cationic dye moiety are present as a complex in an amount of from about 0.2% to 0.5% by weight based on the weight of the photopolymerizable or crosslinkable species in the photohardenable composition.

5. The photohardenable composition of claim 2, wherein said photohardenable composition is employed in a negative working system.

6. The photohardenable composition of claim 1 wherein said photohardenable composition is microencapsulated.

7. The photohardenable composition of claim 6 wherein said photoinitiator additionally comprises an autooxidizer.

8. A photosensitive material comprising a support having a layer of photohardenable composition on the surface thereof, said composition comprising a free radical addition polymerizable or crosslinkable compound and a photoinitiator complex comprising a cationic dye moiety and an anionic borate moiety, said complex being

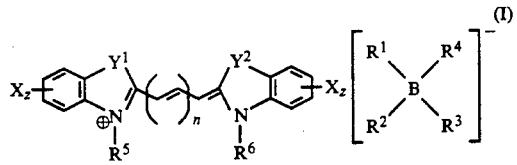

where Y¹ and Y² are the same or different and represent an oxygen atom, a sulfur atom, a selenium atom, a vinyl group, >C(CH₃)₂, or >N-R⁷ wherein R⁷ is a short chain alkyl group; n is 0, 1, 2, or 3; z is 1 to 4; R⁵ and R⁶ represent alkyl groups; and X is a hydrogen atom, an electron withdrawing group or an electron donating group; R¹ is a benzyl or substituted benzyl group; and R², R³ and R⁴ are aryl or substituted aryl groups, wherein said photoinitiator is capable of absorbing actinic radiation and producing free radicals which can initiate free radical polymerization or crosslinking of said polymerizable or crosslinkable compound.

9. The photosensitive material of claim 8 wherein the anionic borate moiety of said photoinitiator complex is benzyltriphenylborate and said cationic dye moiety is selected from the group consisting of cationic cyanine, carbocyanine and hemicyanine dyes.

10. The photosensitive material of claim 9, wherein said photosensitive material is employed in a negative working system.

* * * * *